United States Patent
Liu et al.

(10) Patent No.: US 12,426,302 B2
(45) Date of Patent: Sep. 23, 2025

(54) SEMICONDUCTOR DEVICES AND METHODS OF MANUFACTURING SEMICONDUCTOR DEVICE

(71) Applicant: EPISIL TECHNOLOGIES INC., Hsinchu County (TW)

(72) Inventors: Yuan Liang Liu, Hsinchu County (TW); Yi Chen Lee, Hsinchu County (TW); Yen Chang Chen, Hsinchu County (TW)

(73) Assignee: EPISIL TECHNOLOGIES INC., Hsinchu Country (TW)

( * ) Notice: Subject to any disclaimer, the term of this patent is extended or adjusted under 35 U.S.C. 154(b) by 423 days.

(21) Appl. No.: 18/098,205

(22) Filed: Jan. 18, 2023

(65) Prior Publication Data
US 2023/0307497 A1 Sep. 28, 2023

(30) Foreign Application Priority Data
Mar. 22, 2022 (TW) .................................. 111110474

(51) Int. Cl.
| | |
|---|---|
| *H10D 12/01* | (2025.01) |
| *H10D 30/66* | (2025.01) |
| *H10D 62/832* | (2025.01) |
| *H10D 64/23* | (2025.01) |
| *H10D 62/10* | (2025.01) |

(52) U.S. Cl.
CPC ......... *H10D 30/665* (2025.01); *H10D 12/031* (2025.01); *H10D 62/8325* (2025.01); *H10D 64/256* (2025.01); *H10D 62/106* (2025.01)

(58) Field of Classification Search
CPC ........................ H10D 12/031; H10D 62/8325
See application file for complete search history.

(56) References Cited

U.S. PATENT DOCUMENTS

2017/0012108 A1* 1/2017 Sakakibara ......... H01L 21/0243

OTHER PUBLICATIONS

Office Action and Search Report of Taiwan Appln. No. 111110474.

* cited by examiner

*Primary Examiner* — Daniel P Shook
(74) *Attorney, Agent, or Firm* — BACON & THOMAS, PLLC

(57) ABSTRACT

A semiconductor device comprises: a SiC epitaxial layer and a first recess. The SiC epitaxial layer has: a p-type well region; a heavily doped n-type region on a surface of the p-type well region; and a heavily doped p-type region below the heavily doped n-type region and within the p-type well region. The first recess is formed in the heavily doped p-type region and the heavily doped n-type region, wherein a depth of the first recess exceeds a depth of the heavily doped n-type region.

5 Claims, 8 Drawing Sheets

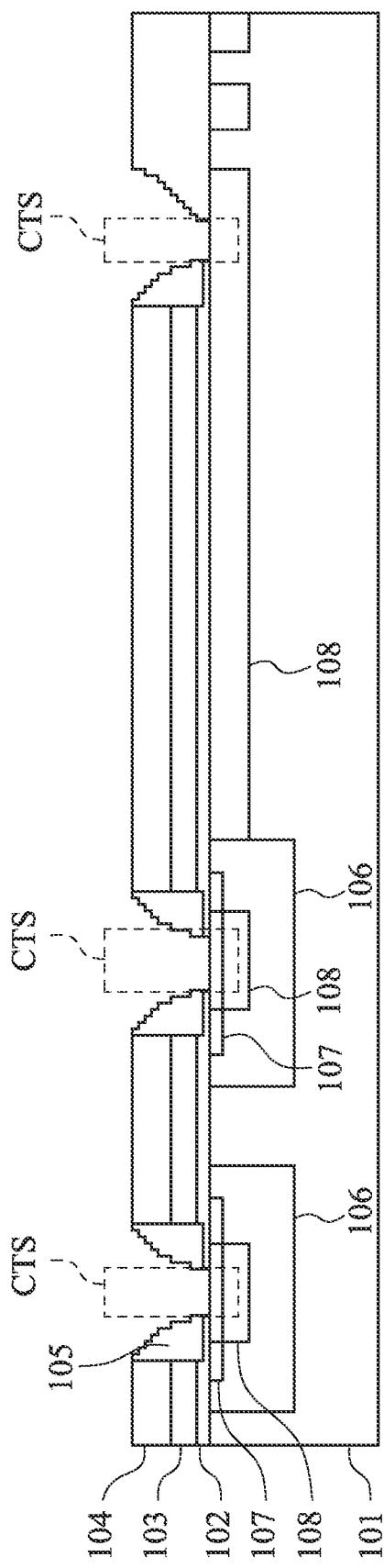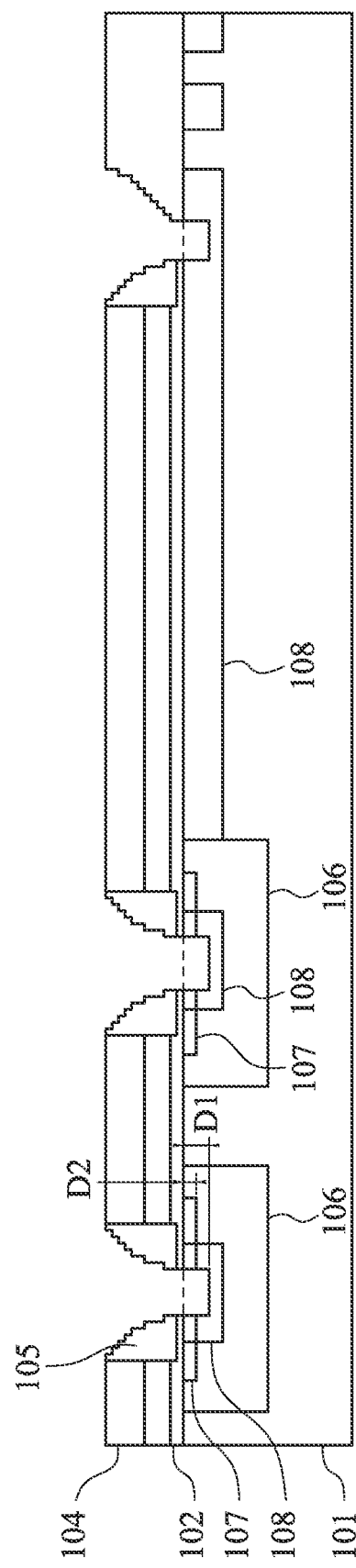
Fig. 7
Fig. 8

US 12,426,302 B2

SEMICONDUCTOR DEVICES AND METHODS OF MANUFACTURING SEMICONDUCTOR DEVICE

BACKGROUND OF THE INVENTION

Field of the Invention

The present invention relates to semiconductor devices, and in particular relates to power metal oxide semiconductor transistors.

Description of the Related Art

For traditional power metal oxide semiconductor transistors, a lithography process is required to form recesses for source contacts, but a photolithography alignment would result in offsets of the overall frame. Such offsets are not easily checked and thus cause the source contacts and the gates to be difficultly miniaturized. Furthermore, the source contacts of the traditional power metal oxide semiconductor transistors need to simultaneously contact the heavily doped n-type region and the heavily doped p-type region in the horizontal direction, which will increase the area of the transistor. Thus, there is a need for a new semiconductor device and a new method for manufacturing a semiconductor device to overcome the said problems.

BRIEF SUMMARY OF THE INVENTION

In light of the previously described problems, the present disclosure provides a semiconductor device comprising a SiC epitaxial layer and a first recess. The SiC epitaxial layer has: a p-type well region; a heavily doped n-type region on a surface of the p-type well region; and a heavily doped p-type region below the heavily doped n-type region and within the p-type well region. The first recess is formed in the heavily doped p-type region and the heavily doped n-type region, wherein a depth of the first recess exceeds a depth of the heavily doped n-type region.

The present disclosure also provides a method of manufacturing a semiconductor device comprising: sequentially depositing a gate oxide layer, a poly silicon layer and a first oxide layer on a SiC epitaxial layer, wherein a p-type well region is disposed in the SiC epitaxial layer, a heavily doped n-type region is disposed on a surface of the p-type well region, and a heavily doped p-type region is disposed below the heavily doped n-type region and within the p-type well region; after gate pattern definition, etching the first oxide layer and the poly silicon layer and stopping etching at the gate oxide layer, wherein a portion of the heavily doped n-type region overlaps with the poly silicon layer; depositing a second oxide layer on the first oxide layer and the heavily doped n-type region; etching the second oxide layer by a first blanket etch process to expose the first oxide layer and the heavily doped n-type region; forming a first recess in a source region by a second blanket etch process, wherein a depth of the first recess exceeds a depth of the heavily doped n-type region.

In summary, in the above-mentioned semiconductor device, because the depth of the first recess exceeds the depth of the heavily doped n-type region, the metal layer serving as the source contact can simultaneously be in contact with the heavily doped n-type region and the heavily doped p-type region in the vertical direction. Therefore, there is no need for the metal layer to simultaneously contact the heavily doped n-type region and the heavily doped p-type region in the horizontal direction, thereby reducing the area of the transistor. In addition, when manufacturing the semiconductor device, there is no need to use a photomask for the source region, so not only the cost is reduced, but also the offsets of the overall frame caused by the photolithography alignment will not occur. Moreover, the area of the unit cell of the transistors can be reduced, and the drain-to-source on-resistance (Rdson) can be decreased, thereby reducing power loss.

BRIEF DESCRIPTION OF THE DRAWINGS

FIG. 7 is another cross-sectional view of the semiconductor device 100.

FIG. 8 is another cross-sectional view of the semiconductor device 100.

DETAILED DESCRIPTION OF THE INVENTION

Figure 1:
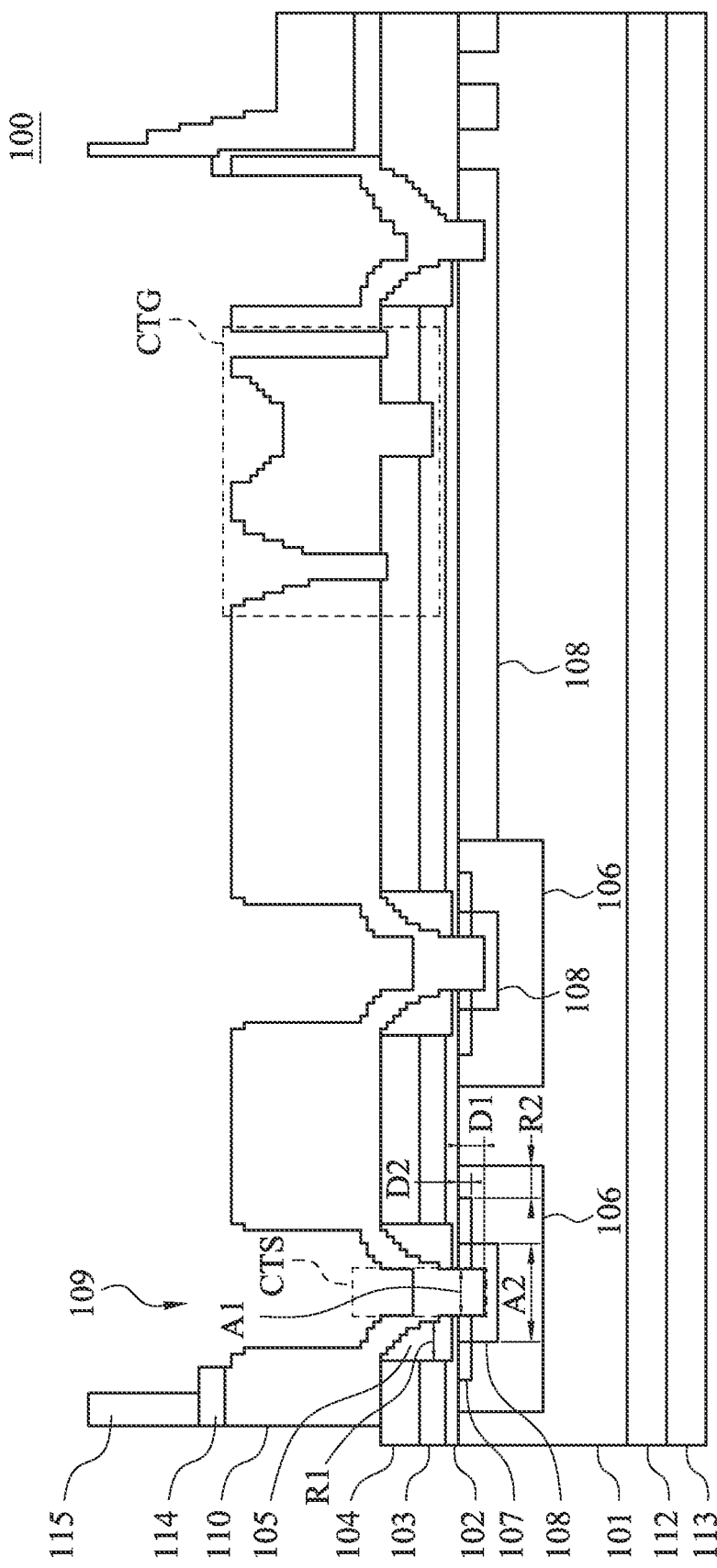
FIG. 1 is a cross-sectional view of a semiconductor device 100 of the present disclosure.

FIG. 1 is a cross-sectional view of a semiconductor device 100 of the present disclosure. As shown in FIG. 1, the semiconductor device 100 comprises: a SiC epitaxial layer 101, a gate oxide layer 102, a poly silicon (polysilicon) layer 103, a first oxide layer 104, a second oxide layer 105, a p-type well region 106, a heavily doped n-type region 107 and a heavily doped p-type region 108. In detail, the p-type well region 106 is in the SiC epitaxial layer 101, the heavily doped p-type region 108 is in the p-type well region 106, and the heavily doped n-type region 107 is on a surface of the p-type well region 106 and partially overlaps with the heavily doped p-type region 108, wherein a depth of the heavily doped p-type region 108 is greater than a depth D2 of the heavily doped n-type region 107. The gate oxide layer 102 is on the SiC epitaxial layer 101 and overlaps with a portion of the heavily doped n-type region 107, the poly silicon layer 103 is on the gate oxide layer 102, and the poly silicon layer 103 can be formed as a gate of a transistor. The first oxide layer 104 is on the poly silicon layer 103, the second oxide layer 105 is on the heavily doped n-type region 107 and is in contact with the gate oxide layer 102, the poly silicon layer 103 and the first oxide layer 104. The metal layer 110 can be used to form a source contact and a gate contact, the metal layer 110 is within the first recess 109 and is simultaneously in contact with the heavily doped p-type region 108 and the heavily doped n-type region 107, the metal layer 110 in the gate region CTG is in contact with the poly silicon layer 103, and the metal layer 110 is also disposed on and in contact with the first oxide layer 104 and the second oxide layer 105, wherein the rule R2 is a channel length of the transistor.

In addition, at the backside of the SiC epitaxial layer 101, the semiconductor device 100 also comprises a SiC substrate 112 under the SiC epitaxial layer 101 and a metal layer 113 under the SiC substrate 112. The metal layer 113 under the SiC substrate 112 can be used to form a drain contact, and the composition of the metal layer 110 and the metal layer 113 can include Ni, Ti, TiN, AlCu, etc., but is not limited thereto. In some embodiments, a passivation layer 114 can be further disposed on the metal layer 110, and a polyimide layer 115 can also be disposed on the passivation layer 114.

In traditional power metal oxide semiconductor transistors, the area A1 of the source region CTS needs to be greater than the area A2 of the heavily doped p-type region 108 to make the metal layer 110 in the source region CTS be simultaneously in contact with the heavily doped n-type region 107 and the heavily doped p-type region 108 in the horizontal direction. However, in the semiconductor device 100 of the present disclosure, because a depth D1 of the first recess 109 exceeds the depth D2 of the heavily doped n-type region, the metal layer 110 in the source region CTS can simultaneously contact the heavily doped n-type region 107 and the heavily doped p-type region 108 in the vertical direction, which results in that there is no need for the area A1 of the source region CTS to be greater than the area A2 of the heavily doped p-type region 108, and thus that the semiconductor device 100 of the present disclosure can have a smaller area (about 20%-30% area reduction). In addition, in some embodiments, the area A2 of the heavily doped p-type region 108 of the present disclosure can be greater than the area of the traditional heavily doped p-type region, so the reduction of the area of the transistor and the decrease of the forward voltage Vf can be achieved at the same time, thereby reducing power loss.

Figure 2:
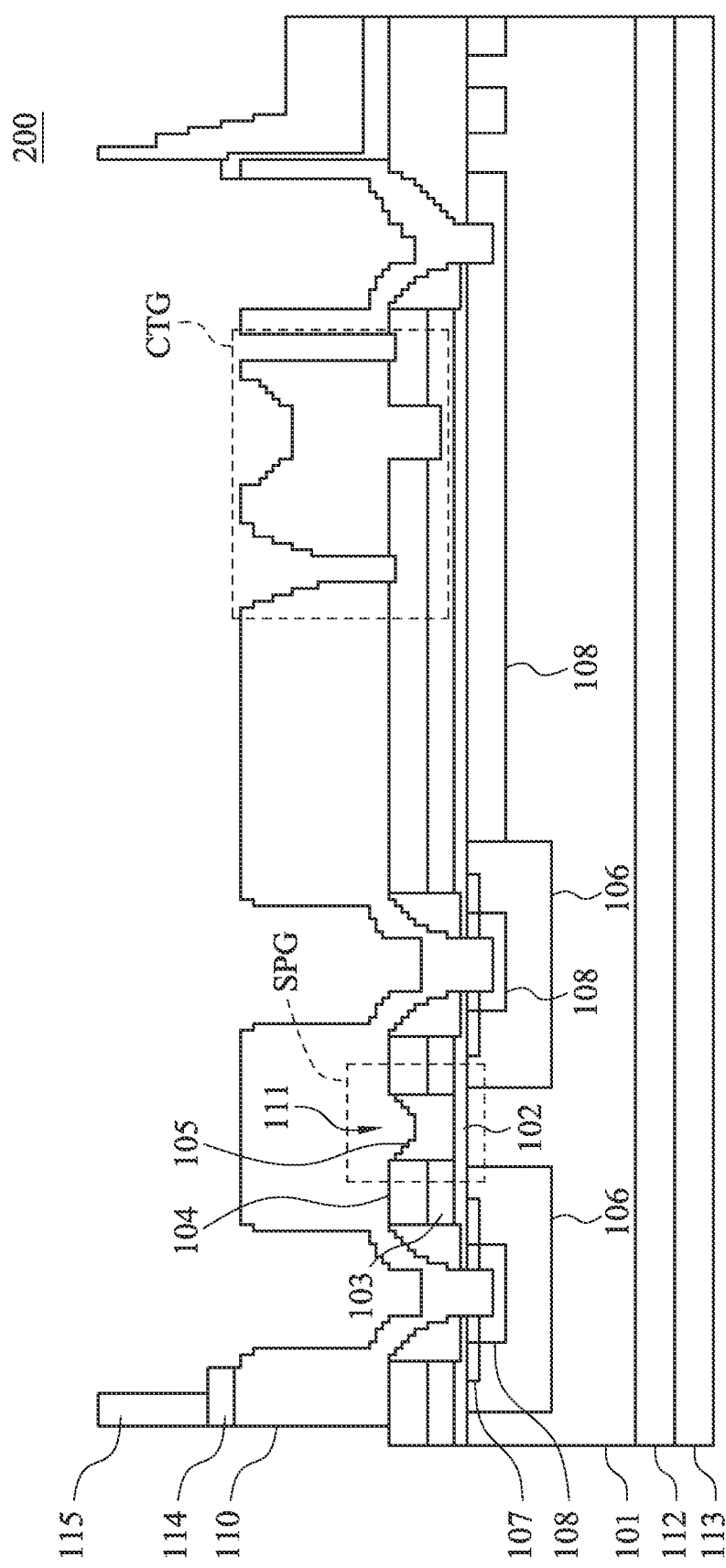
FIG. 2 is a cross-sectional view of a semiconductor device 200 of the present disclosure.

FIG. 2 is a cross-sectional view of a semiconductor device 200 of the present disclosure. The semiconductor device 200 is similar to the semiconductor device 100 except that the semiconductor device 200 is a split gate transistor. In detail, the semiconductor device 200 further includes a second recess 111 formed in the poly silicon layer 103 and the first oxide layer 104 in the split gate region SPG without passing through the gate oxide layer 102. The second oxide layer 105 is also disposed in the second recess 111 and is in contact with the gate oxide layer 102, the poly silicon layer 103 and the first oxide layer 104 at the same time, and the metal layer 110 is not in contact with the poly silicon layer 103. In some embodiments, the minimum height of the second oxide layer 105 in the second recess 111 may be greater than the thickness of the poly silicon layer 103. In other words, since the semiconductor device 200 of the present disclosure has the first oxide layer 104, the second oxide layer 105 in the second recess 111 is thicker, which prevents the metal layer 110 from contacting the poly silicon layer 103. Furthermore, by using the split gate transistor of the semiconductor device 200, the gate drain charge (gate charge, Qgd) can be reduced to improve the figures of merits (FOM) (Rds(on)×Cgd), so as to reduce energy loss due to switching. In tranditional power MOSFETs, the metal layer 110 and the poly silicon layer 103 are prevented from generating gate-to-source leakage current by increasing the extra area of the junction field effect (JFET) region. However, since the semiconductor device 200 of the present disclosure has the first oxide layer 104, the thickness of the second oxide layer 105 on the sidewall of the second recess 111 becomes thicker. Therefore, there is no need to increase the area of the junction field effect region, thereby reducing the area of the transistor.

Figure 3:
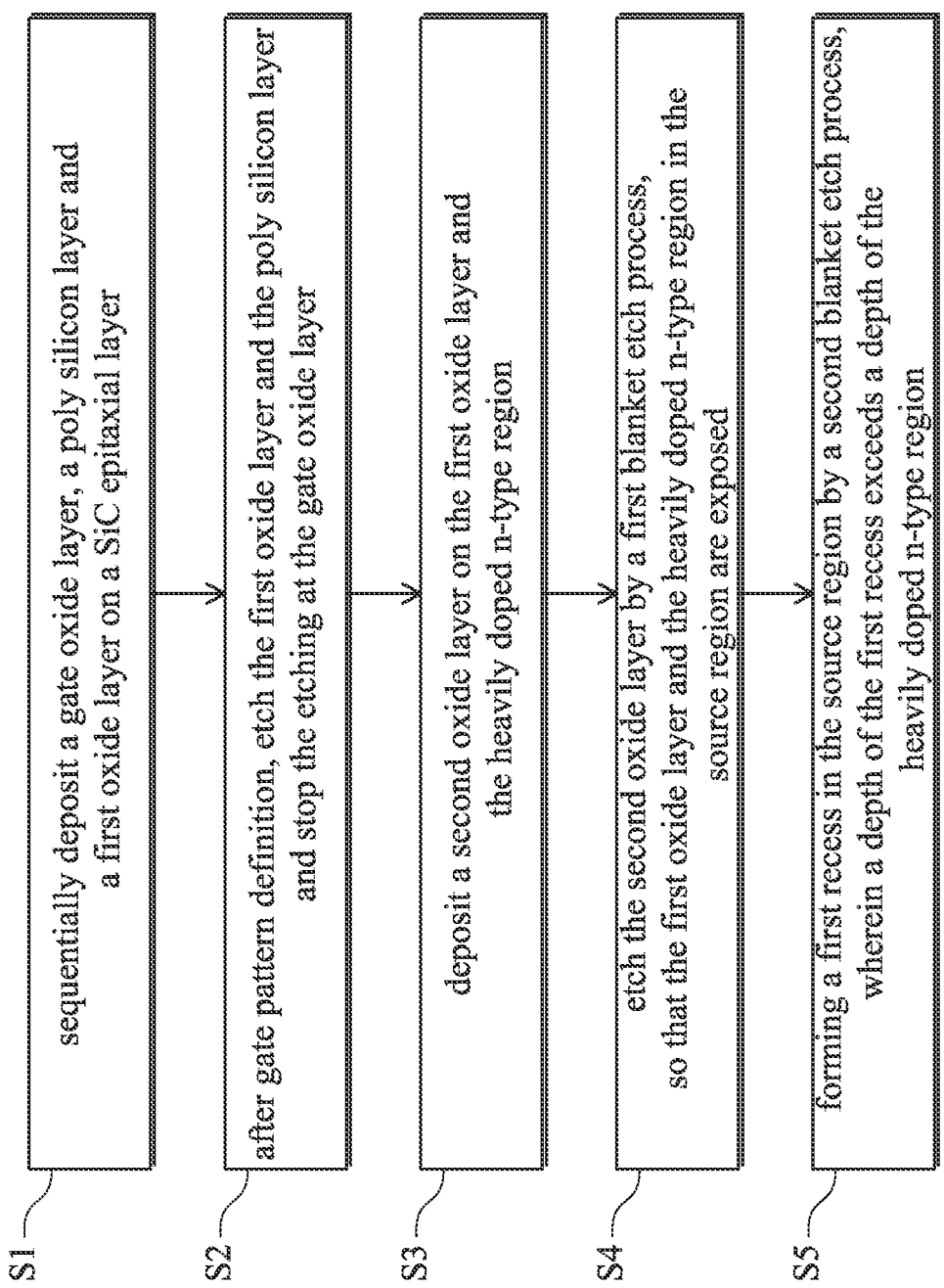
FIG. 3 is a flow chart of a method 300 for manufacturing a semiconductor device of the present disclosure.
Figure 4:
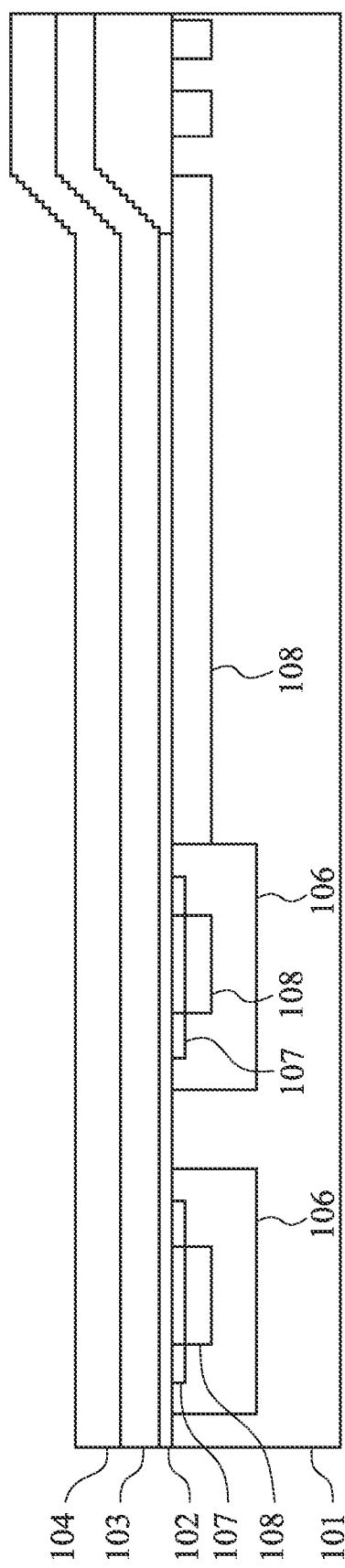
FIG. 4 is another cross-sectional view of the semiconductor device 100.
Figure 5:
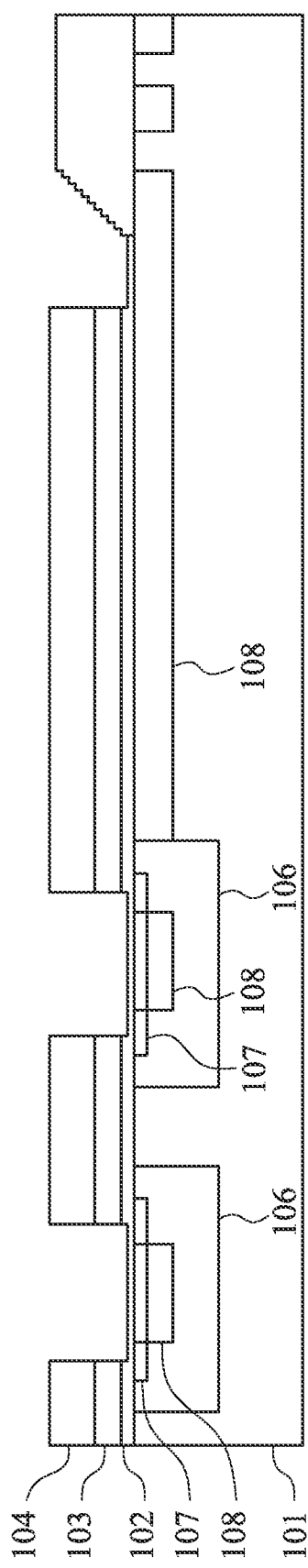
FIG. 5 is another cross-sectional view of the semiconductor device 100.
Figure 6:
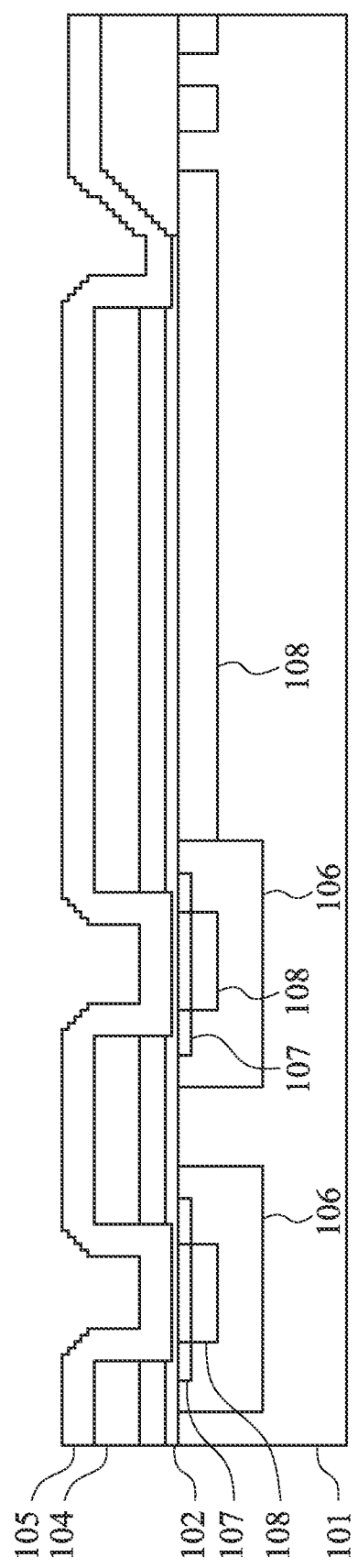
FIG. 6 is another cross-sectional view of the semiconductor device 100.

FIG. 3 is a flow chart of a method 300 of manufacturing a semiconductor device of the present disclosure, and FIGS. 4 to 8 are cross-sectional views of the semiconductor device 100 for illustrating steps S1-S5 of the method 300. As shown in FIG. 4, first of all, in step S1, the gate oxide layer 102, the poly silicon layer 103 and the first oxide layer 104 are sequentially deposited on the SiC epitaxial layer 101, wherein a p-type well region 106 is disposed in the SiC epitaxial layer 101, a heavily doped n-type region 107 is disposed on the surface of the p-type well region 106, and the depth of the heavily doped p-type region 108 in the p-type well region 106 is greater than the depth of the heavily doped n-type region 107. A portion of the heavily doped n-type region 107 overlaps with the poly silicon layer 103. As shown in FIG. 5, in step S2, after gate pattern definition, the first oxide layer 104 and the poly silicon layer 103 are etched and the etching is stopped at the gate oxide layer 102. As shown in FIG. 6, in step S3, a second oxide layer 105 is deposited on the first oxide layer 104 and the heavily doped n-type region 107. As shown in FIG. 7, in step S4, the second oxide layer 105 is etched by a first blanket etch process, so that the first oxide layer 104 and the heavily doped n-type region 107 in the source region CTS are exposed, wherein during the first blanket etch process, the oxide layer (e.g., the second oxide layer 105) has a higher etch selectivity than the SiC epitaxial layer 101. As shown in FIG. 8, in step S5, a first recess 109 is formed in the source region CTS by a second blanket etch process, wherein during the second blanket etch process, the SiC epitaxial layer 101 has higher etching selectivity than the oxide layer (e.g., the first oxide layer 104 and the second oxide layer 105), and the depth D1 of the first recess 109 exceeds the depth D2 of the heavily doped n-type region 107. In addition, the method 300 may further comprise step S6. As shown in FIG. 1, a metal layer 110 is deposited on the gate region CTG and the source region CTS, wherein the metal layer 110 can be used to form the source contact and the gate contact. The method 300 further comprises step S7, a metal layer 113 is formed under the SiC substrate 112 under the SiC epitaxial layer 101, and the metal layer 113 under the SiC substrate 112 can be used to form a drain contact.

With the method 300 of the present disclosure, the distance (also referred to as rule) R1 between the poly silicon layer 103 and the source region CTS can be reduced by controlling the deposition and etching of the second oxide layer 105 without the use of the photomask for the source region CTS, which not only reduces the cost, but also does not cause the offsets of the overall frame caused by the photolithography alignment. Furthermore, the area of the unit cell of the transistors can be reduced and the on-resistance from the drain to the source can also be reduced, thereby reducing power loss.

Figure 9:
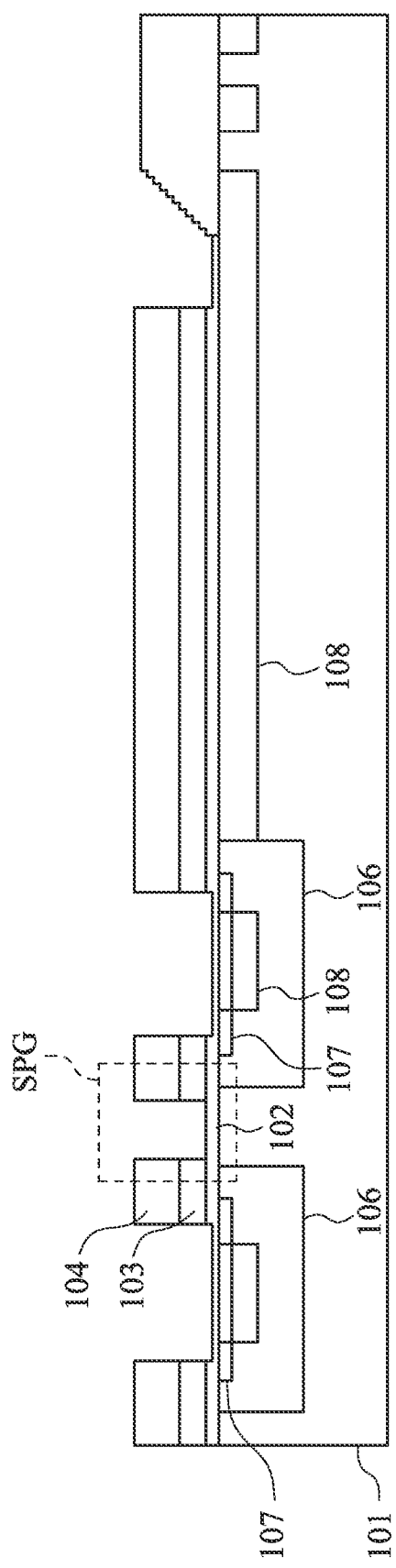
FIG. 9 is another cross-sectional view of the semiconductor device 200.
Figure 10:
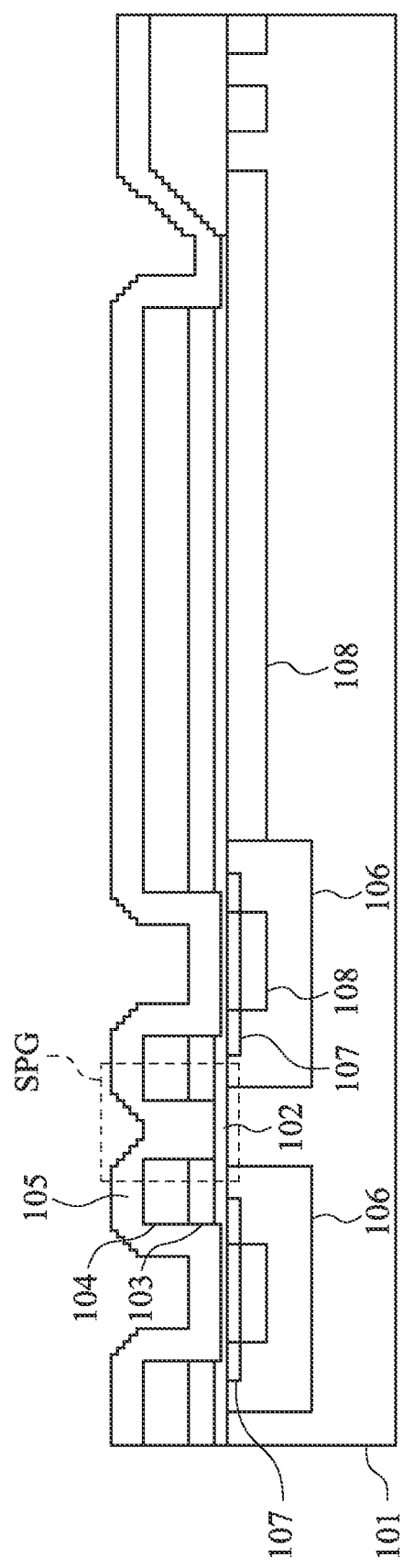
FIG. 10 is another cross-sectional view of the semiconductor device 200.
Figure 11:
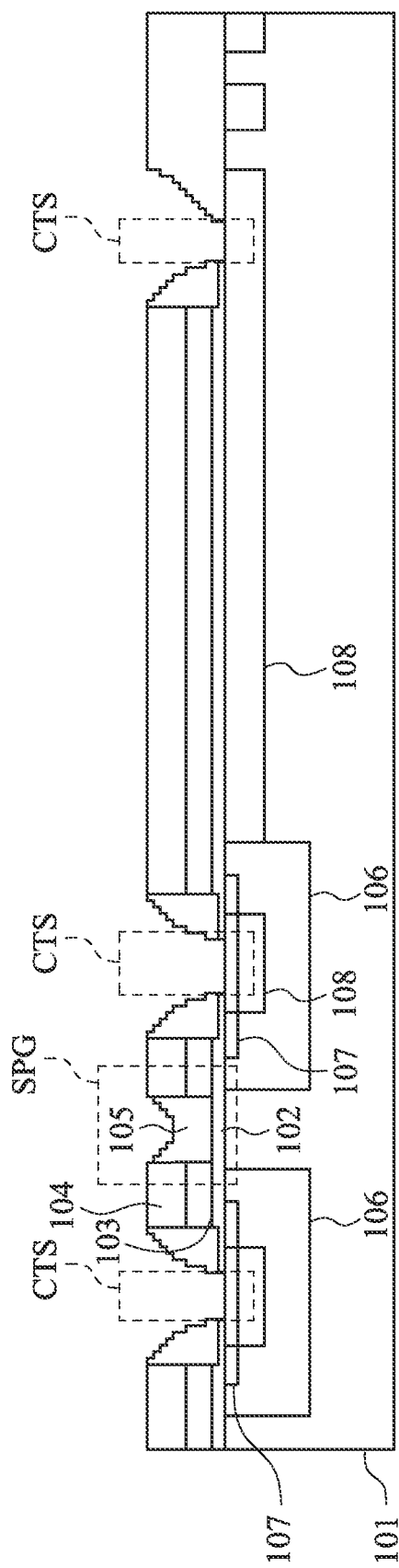
FIG. 11 is another cross-sectional view of the semiconductor device 200.
Figure 12:
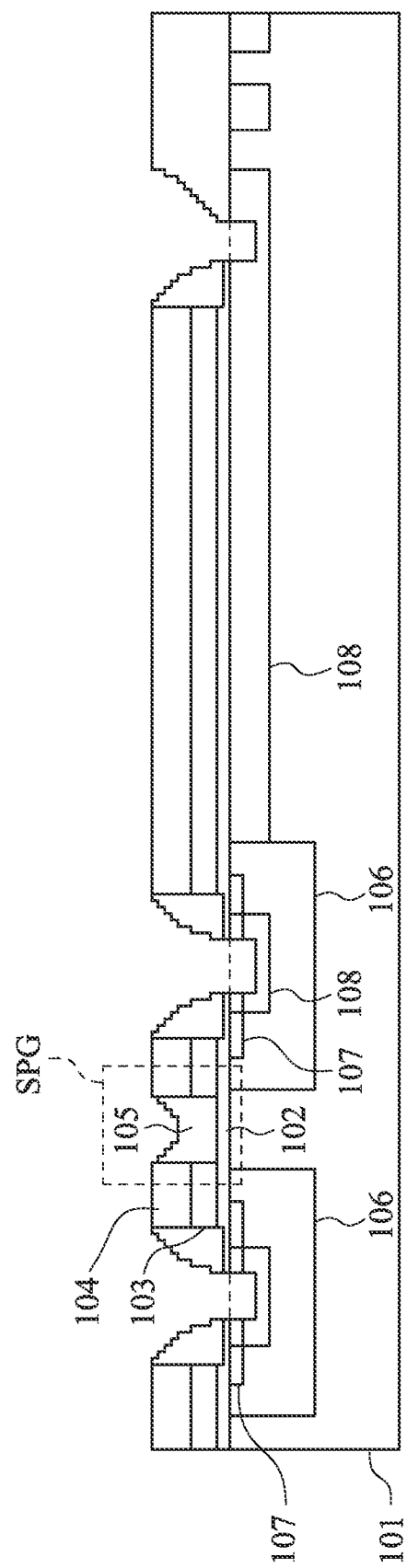
FIG. 12 is another cross-sectional view of the semiconductor device 200.

In some embodiments of the present disclosure, the method 300 may also be adapted to the split gate transistors. FIGS. 9 to 12 are cross-sectional views of the semiconductor device 200 to illustrate additional steps of the method 300. In detail, before the second oxide layer 105 (for example, before step S3) is deposited, the method 300 further comprises that the first oxide layer 104 and the poly silicon layer 103 in the split gate region SPG are etched to expose the gate oxide layer 102, as shown in FIG. 9. Afterwards, when the second oxide layer 105 is deposited on the first oxide layer 104 and the heavily doped n-type region 107 (e.g., step S3), the second oxide layer 105 is also deposited on the gate oxide layer 102 in the split gate region SPG, simultaneously, as shown in FIG. 10. When the second oxide layer 105 is etched by the first blanket etch process (e.g., step S4), as shown in FIG. 11, making the poly silicon layer 103 unexposed in the split gate region SPG is performed. Specifically, By making the thickness of the second oxide layer 105 greater than the width of the second recess 111 when the second oxide layer 105 is deposited, after the second oxide layer 105 is etched by the first blanket etch process, the thickness of the second oxide layer 105 in the second recess 111 can be prevented from being too thin to generate leakage current between the metal layer 110 and the poly silicon layer 103. After the second blanket etch process (such as step S5) is performed, since the SiC epitaxial layer 101 has a higher etching selectivity in the second blanket etch process, the second oxide layer 105 in the split gate region SPG is not etched but still covers the second recess 111 and is higher than the poly silicon layer 103, as shown in FIG. 12. Step S6 is then performed to form the structure as shown in FIG. 2.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a semiconductor device comprising:
   sequentially depositing a gate oxide layer, a poly silicon layer and a first oxide layer on a SiC epitaxial layer, wherein a p-type well region is disposed in the SiC epitaxial layer, a heavily doped n-type region is disposed on a surface of the p-type well region, and a heavily doped p-type region is disposed below the heavily doped n-type region and within the p-type well region;
   after gate pattern definition, etching the first oxide layer and the poly silicon layer and stopping etching at the gate oxide layer, wherein a portion of the heavily doped n-type region overlaps with the poly silicon layer;
   depositing a second oxide layer on the first oxide layer and the heavily doped n-type region;
   etching the second oxide layer by a first blanket etch process to expose the first oxide layer and the heavily doped n-type region;
   forming a first recess in a source region by a second blanket etch process, wherein a depth of the first recess exceeds a depth of the heavily doped n-type region.

2. The method of claim 1, further comprising:
   before the second oxide layer is deposited, etching the poly silicon layer and the first oxide layer in a gate region to expose the gate oxide layer;
   when the second oxide layer is deposited on the first oxide layer and the heavily doped n-type region, simultaneously depositing the second oxide layer on the gate oxide layer in the gate region; and
   when the second oxide layer is etched by the first blanket etch process, making the poly silicon layer unexposed in the gate region.

3. The method of claim 1, further comprising:
   depositing a first metal layer on a gate region and the source region.

4. The method of claim 1, further comprising:
   forming a second metal layer under a SiC substrate under the SiC epitaxial layer.

5. The method of claim 1, wherein the SiC epitaxial layer has a higher etch selectivity than the first oxide layer and the second oxide layer during the second blanket etch process.

* * * * *